(12) United States Patent
Sunohara et al.

(10) Patent No.: US 7,592,700 B2
(45) Date of Patent: Sep. 22, 2009

(54) SEMICONDUCTOR CHIP AND METHOD OF MANUFACTURING SEMICONDUCTOR CHIP

(75) Inventors: Masahiro Sunohara, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/545,233

(22) Filed: Oct. 10, 2006

(65) Prior Publication Data

US 2007/0085189 A1 Apr. 19, 2007

(30) Foreign Application Priority Data

Oct. 18, 2005 (JP) .............................. 2005-303443

(51) Int. Cl.
 *H01L 23/48* (2006.01)
(52) U.S. Cl. ..................... 257/737; 257/686; 257/774; 257/784; 257/E23.011; 257/777
(58) Field of Classification Search ................. 257/774, 257/784, 686, 737, E23.011, 777
See application file for complete search history.

(56) References Cited

U.S. PATENT DOCUMENTS

| 6,232,666 | B1 | 5/2001 | Corisis et al. |
| 6,294,837 | B1 * | 9/2001 | Akram et al. ................ 257/774 |
| 6,551,905 | B1 | 4/2003 | Barsky et al. |
| 6,894,389 | B2 * | 5/2005 | Isobe .......................... 257/737 |
| 6,982,487 | B2 * | 1/2006 | Kim et al. .................... 257/774 |
| 2002/0017710 | A1 | 2/2002 | Kurashima et al. |
| 2002/0190375 | A1 | 12/2002 | Mashino et al. |
| 2005/0127478 | A1 | 6/2005 | Hiatt et al. |
| 2005/0287783 | A1 | 12/2005 | Kirby et al. |
| 2006/0043599 | A1 * | 3/2006 | Akram et al. ................ 257/774 |

FOREIGN PATENT DOCUMENTS

| EP | 1 248 295 A2 | 10/2002 |
| EP | 1 489 658 A2 | 12/2004 |
| JP | 2002-373895 | 12/2002 |

OTHER PUBLICATIONS

European Search Report Dated Jul. 21, 2008; Application No./Patent No. 06255217.9-1528 / 1777742.

* cited by examiner

*Primary Examiner*—Victor A Mandala
(74) *Attorney, Agent, or Firm*—Ladas & Parry LLP

(57) ABSTRACT

A semiconductor chip includes a semiconductor substrate having a first principal surface, and having a device layer on the first principal surface in which a semiconductor device is formed, an electrode pad disposed on the first principal surface of the semiconductor substrate and electrically connected to the semiconductor device, a through via formed in a through hole penetrating through the semiconductor substrate and the electrode pad, and an Au bump deposited on the electrode pad and the through via such as to electrically connect between the electrode pad and the through via.

2 Claims, 12 Drawing Sheets

SEMICONDUCTOR CHIP AND METHOD OF MANUFACTURING SEMICONDUCTOR CHIP

BACKGROUND OF THE INVENTION

1. Field of the Invention

The present invention generally relates to semiconductor chips and methods of manufacturing semiconductor chips, and particularly relates to a semiconductor chip and a method of manufacturing a semiconductor chip that is provided with a through via penetrating through the semiconductor substrate and electrode pads.

2. Description of the Related Art

Keeping pace with the recent sophistication and miniaturization of electronic devices, there has been progress in the development of multi-chip packages in which a plurality of semiconductor chips are stacked one over another. Semiconductor chips used in multi-chip packages have a through via that is electrically connected to other semiconductor chips disposed on its top and beneath its bottom. Such through via includes one that is formed to penetrate through the semiconductor substrate and an electrode pad as shown in FIG. 1.

Figure 1:
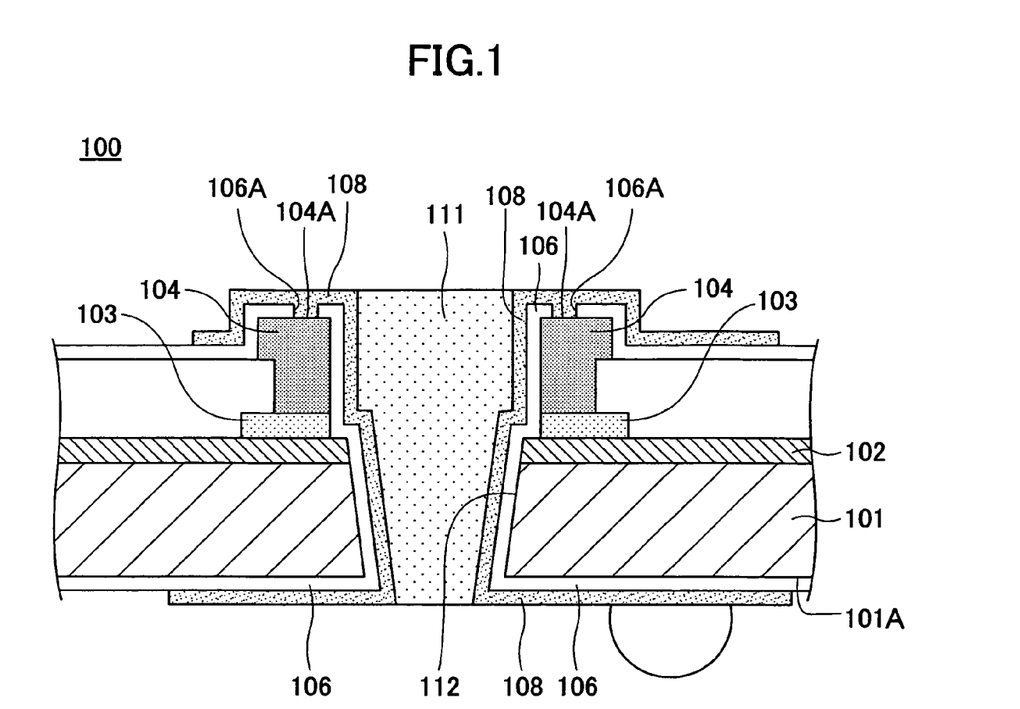
FIG. 1 is a cross-sectional view of a related-art semiconductor chip.

FIG. 1 is a cross-sectional view of a related-art semiconductor chip.

As shown in FIG. 1, a semiconductor chip 100 includes a semiconductor substrate 101, a semiconductor-device layer 102 in which semiconductor devices (not shown) are formed, an electrode pad 103, a conductive metal member 104, an insulating film 106, a metal layer 108, and a through via 111.

A through hole 112 that penetrates through the semiconductor-device layer 102, the electrode pad 103, and the conductive metal member 104 is formed in the semiconductor substrate 101. The electrode pad 103 is electrically connected to the conductive metal member 104 and a semiconductor device (not shown). The conductive metal member 104 serves to protect the electrode pad 103 from damage when forming an opening part 106A through the insulating film 106 by laser processing.

The insulating film 106 is formed to cover the back surface 101A of the semiconductor substrate 101, the conductive metal member 104, and the through hole 112. The insulating film 106 has the opening part 106A that exposes an upper surface 104A of the conductive metal member 104.

The metal layer 108 is provided such as to cover the side wall of the through hole 112 on which the insulating film 106 is formed, and also to fill the opening part 106A.

The through via 111 is situated in the through hole 112 that has the insulating film 106 and the metal layer 108 formed therein. The through via 111 is electrically connected to the electrode pad 103 via the metal layer 108 and the conductive metal member 104. The through via 111 is formed by use of an electroplating method for which the metal layer 108 is used as a power feeding layer.

The semiconductor chip 100 having such a configuration as describe above is electrically connected to another semiconductor chip through solder that is deposited on a tip of the through via 111 (see Patent Document 1, for example).

[Patent Document 1] Japanese Patent Application Publication No. 2002-373895

In the semiconductor chip 100 having a conventional structure as described above, however, the conductive metal member 104 and/or the metal layer 108 are provided to electrically connect the electrode pad 103 with the through via 111, giving rise to the problem of cost increases.

Further, the provision of the conductive metal member 104 and the metal layer 108 adds to the complexity of the process of manufacturing the semiconductor chip 100, resulting in a problem that the manufacturing cost of the semiconductor chip 100 increases.

Moreover, the provision of the conductive metal member 104 results in the deepening of the through hole 112, which elongates the time of the electroplating process for forming the through via 111. This also increases the manufacturing cost of the semiconductor chip 100.

It should also be noted that the through via 111 is formed through the deposition and growth of conductive metal on the metal layer 108 formed on the insulating film 106. Because of this, there is a problem in that a void may be created at the center of the through via 111.

Accordingly, there is a need for a semiconductor chip and a method of manufacturing the semiconductor chip that can avoid the generation of a void in the through via and can also reduce the cost inclusive of the manufacturing cost.

SUMMARY OF THE INVENTION

It is a general object of the present invention to provide a semiconductor chip and a method of manufacturing the semiconductor chip that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor chip and a method of manufacturing the semiconductor chip particularly pointed out in the specification in such full, clear, concise, and exact terms as to enable a person having ordinary skill in the art to practice the invention.

To achieve these and other advantages in accordance with the purpose of the invention, the invention provides a semiconductor chip, which includes a semiconductor substrate having a first principal surface, and having a device layer on the first principal surface in which a semiconductor device is formed, an electrode pad disposed on the first principal surface of the semiconductor substrate and electrically connected to the semiconductor device, a through via formed in a through hole penetrating through the semiconductor substrate and the electrode pad, and an Au bump deposited on the electrode pad and the through via such as to electrically connect between the electrode pad and the through via.

According to at least one embodiment of the present invention, the Au bump is disposed on the electrode pad and the through via so as to be electrically connected to the electrode pad and the through via, thereby making the depth of the through hole smaller than in the case of a conventional semiconductor chip. With this provision, the length of the through via becomes short, thereby reducing the cost of the semiconductor chip.

According to another aspect of the present invention, a method of making a semiconductor chip, which includes a semiconductor substrate having a first principal surface, and having a device layer on the first principal surface in which a semiconductor device is formed, and an electrode pad disposed on the first principal surface of the semiconductor substrate and electrically connected to the semiconductor device, includes a through hole forming step of forming a through hole penetrating through the semiconductor substrate and the electrode pad, an insulating film forming step of forming an insulating film on a side wall of the through hole, an Au bump forming step using wire bonding technology of forming an Au bump on the electrode pad and in the through hole on a side of the semiconductor substrate corresponding to the first principal surface after the insulating film forming step, and a through via forming step of forming a through via in the through hole by an electroplating process utilizing the Au bump as a power feeding layer.

According to at least one embodiment of the present invention, the Au bump is formed on the electrode pad and in the through hole on the side corresponding to the first principal surface after the insulating film forming step, so that an electrical connection can more easily be established between the electrode pad and the through via, compared with the conventional semiconductor chip. This can simplify the manufacturing steps of the semiconductor chip, and can also reduce the manufacturing cost of the semiconductor chip.

Further, the electroplating process utilizing the Au bump as a power feeding layer is performed to form the through via such that conductive metal to become the through via is deposited to grow from the Au bump along the depth direction of the through hole. This provision can prevent a void from appearing in the through via.

According to at least one embodiment of the present invention, the generation of a void in the through via is avoided, and the cost of the semiconductor chip inclusive of the manufacturing cost is reduced.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 2:
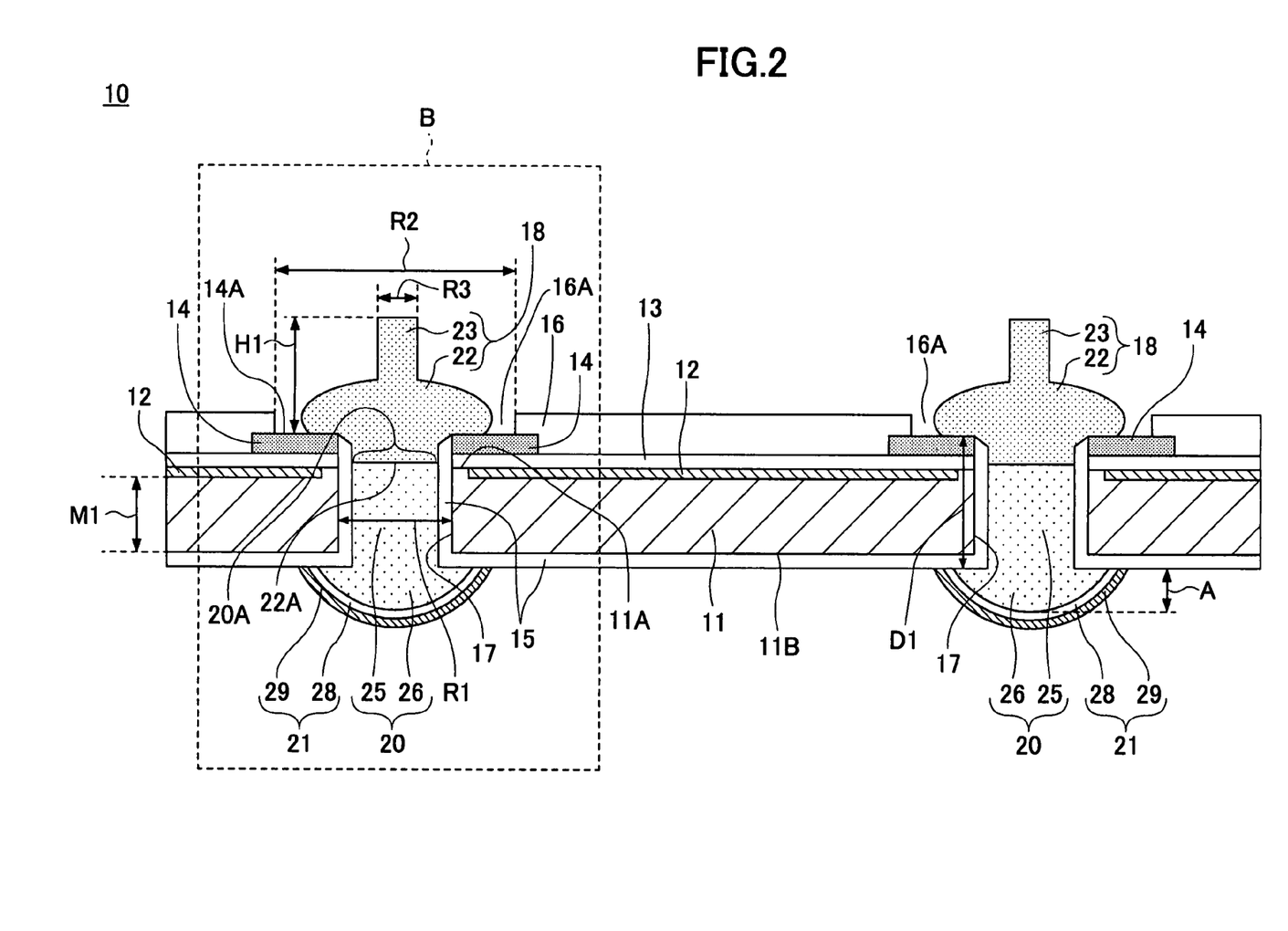
FIG. 2 is a cross-sectional view of a semiconductor chip according to an embodiment of the present invention.

FIG. 2 is a cross-sectional view of a semiconductor chip according to an embodiment of the present invention. In FIG. 2, "A" represents the elevation of a projection 26 relative to an insulating film 15 that is disposed on a second principal surface 11B of a semiconductor substrate 11, and will hereinafter be referred to as a "projection elevation A". "D1" represents the depth of a through hole 17, and will hereinafter be referred to as a "depth D1". "H1" represents the height of an Au bump 18 with reference to an upper surface 14A of an electrode pad 14, and will hereinafter be referred to as a "height H1".

As shown in FIG. 2, a semiconductor chip 10 includes a semiconductor substrate 11, a semiconductor-device layer 12, insulating films 13 and 15, electrode pads 14, a protection film 16, Au bumps 18, through vias 20, and dispersion preventive films 21.

The semiconductor substrate 11 is made into a thin plate, through which through holes 17 are formed. The through holes 17 are formed such as to penetrate through the semiconductor substrate 11, the insulating film 13, and the electrode pads 14. Silicon or compound semiconductor such as GaAs may be used as the material of the semiconductor substrate 11. The thickness M1 of the semiconductor substrate 11 made into a thin plate may be 300 micrometers, for example. The diameter R1 of the through holes 17 may be 30 micrometers, for example.

The semiconductor-device layer 12 is situated on a first principal surface 11A of the semiconductor substrate 11. The semiconductor-device layer 12 is not provided at the positions of the semiconductor substrate 11 where the through holes 17 are formed. Semiconductor devices (not shown) such as transistors are formed in the semiconductor-device layer 12. The semiconductor devices are electrically connected to the electrode pads 14 through interconnect patterns (not shown).

The insulating film 13 is situated on the first principal surface 11A of the semiconductor substrate 11 and on the semiconductor-device layer 12. The insulating film 13 may be formed by use of the CVD method. SiO$_2$ film or SiN film may be used as the insulating film 13, for example. The thickness of the insulating film 13 may be 0.1 to 1.0 micrometers, for example.

The electrode pads 14 are disposed on the insulating film 13. The electrode pads 14 are electrically connected to semiconductor devices (not shown) through interconnect patterns (not shown). Al may be used as the material of the electrode pads 14. The electrode pads 14 may be formed by growing an Al film on the insulating film 13 through sputtering and by patterning the Al film by dry etching.

The insulating film 15 is disposed to cover the second principal surface 11B of the semiconductor substrate 11 and the side walls of the through holes 17. The insulating film 15 serves to insulate between the semiconductor substrate 11 and the through vias 20. The insulating film 15 may be formed by use of the CVD method, for example. SiO$_2$ film or SiN film, for example, may be used as the insulating film 15. The thickness of the insulating film 15 may be 1 micrometer, for example.

The protection film 16 is disposed on the insulating film 13, and has openings 16A that expose the electrode pads 14. The diameter R2 of the openings 16A may be 80 micrometers, for example. An SiN film formed by the CVD method or a polyimide film formed by the spin coating method, for example, may be used as the protection film 16.

The Au bumps 18 are disposed on the electrode pads 14 and the through vias 20. The Au bumps 18 are electrically connected to the electrode pads 14 and the through vias 20. The Au bumps 18 serve to function as external connection terminals. The height H1 of the Au bumps 18 may be 70 micrometers to 80 micrometers, for example.

In this manner, the Au bumps 18 are disposed on the electrode pads 14 and the through vias 20 so as to be electrically connected to the electrode pads 14 and the through vias 20, thereby making the depth D1 of the through holes 17 smaller than the depth of the conventional through hole 112. With this provision, the length of the through vias 20 formed in the through holes 17 becomes short, thereby reducing the cost of the semiconductor chip 10.

Each of the Au bumps 18 includes a ball-shape part 22 and a rod-shape part 23. The ball-shape part 22 is disposed on an electrode pad 14 and a through via 20 such as to intrude into a through hole 17. A tip 22A of the ball-shape part 22 positioned in the through hole 17 is in contact with an end surface 20A of the through via 20.

In this manner, the ball-shape part 22 of an Au bump 18 is provided such as to intrude into the through hole 17, so that the depth of the through hole 17 can be made smaller than in the case in which the tip 22A of the ball-shape part 22 is flush with the upper surface 14A of the electrode pad 14. With this provision, the length of the through via 20 further becomes short, thereby reducing the cost of the semiconductor chip 10.

The rod-shape part 23 is provided on the side of the ball-shape part 22 opposite to the side on which connection with the through via 20 is provided. When the semiconductor chip 10 is to be connected to another semiconductor chip or to a substrate such as a mother board, the rod-shape part 23 is bonded to an electrode pad of such another semiconductor chip or a pad of the substrate such as a mother board through thermal compression bonding or ultrasonic bonding. In this manner, the semiconductor chip 10 is electrically connected to another semiconductor chip or to a substrate such as a mother board. In the case of thermal compression bonding, the Au bumps 18 are heated at around a temperature of 300 degrees Celsius so as to melt the rod-shape part 23 for the bonding purpose. The diameter R3 of the rod-shape part 23 may be 20 micrometers, for example.

Each of the through vias 20 includes a through part 25 and a projection 26. The through part 25 is situated in the through hole 17 that has the insulating film 15 formed therein. An upper end of the through part 25 (i.e., the end surface 20A of the through via 20) is electrically connected to the Au bump 18.

The projection 26 is situated at the bottom of the through part 25, and is formed as an integral unitary structure with the through part 25. The projection 26 is disposed to protrude from the insulating film 15 formed on the second principal surface 11B of the semiconductor substrate 11, and is made to have a broader width than the through part 25. The projection 26 serve to function as an external connection terminal. When the semiconductor chip 10 is to be connected to another semiconductor chip or to a substrate such as a mother board, the projection 26 is electrically connected to an electrode pad of such another semiconductor chip or a pad of the substrate such as a mother board. The elevation A of the projection 26 may be 20 micrometers to 60 micrometers, for example. The through vias 20 may be formed by use of the electroplating method, for example.

Each of the dispersion preventive films 21 includes an Ni layer 28 and an Au layer 29. The Ni layer 28 is provided to cover the projection 26. The Au layer 29 is disposed such as to cover the Ni layer 28.

According to the semiconductor chip of this embodiment, the Au bumps 18 are disposed on the electrode pads 14 and the through vias 20 so as to be electrically connected to the electrode pads 14 and the through vias 20, thereby making the depth D1 of the through holes 17 smaller than the depth of the conventional structure. With this provision, the length of the through vias 20 formed in the through holes 17 becomes short, thereby reducing the cost of the semiconductor chip 10.

With the configuration in which the ball-shape parts 22 of the Au bumps 18 are provided to intrude into the respective through holes 17, the length of the through vias 20 further becomes short, thereby further reducing the cost of the semiconductor chip 10.

Figure 3:
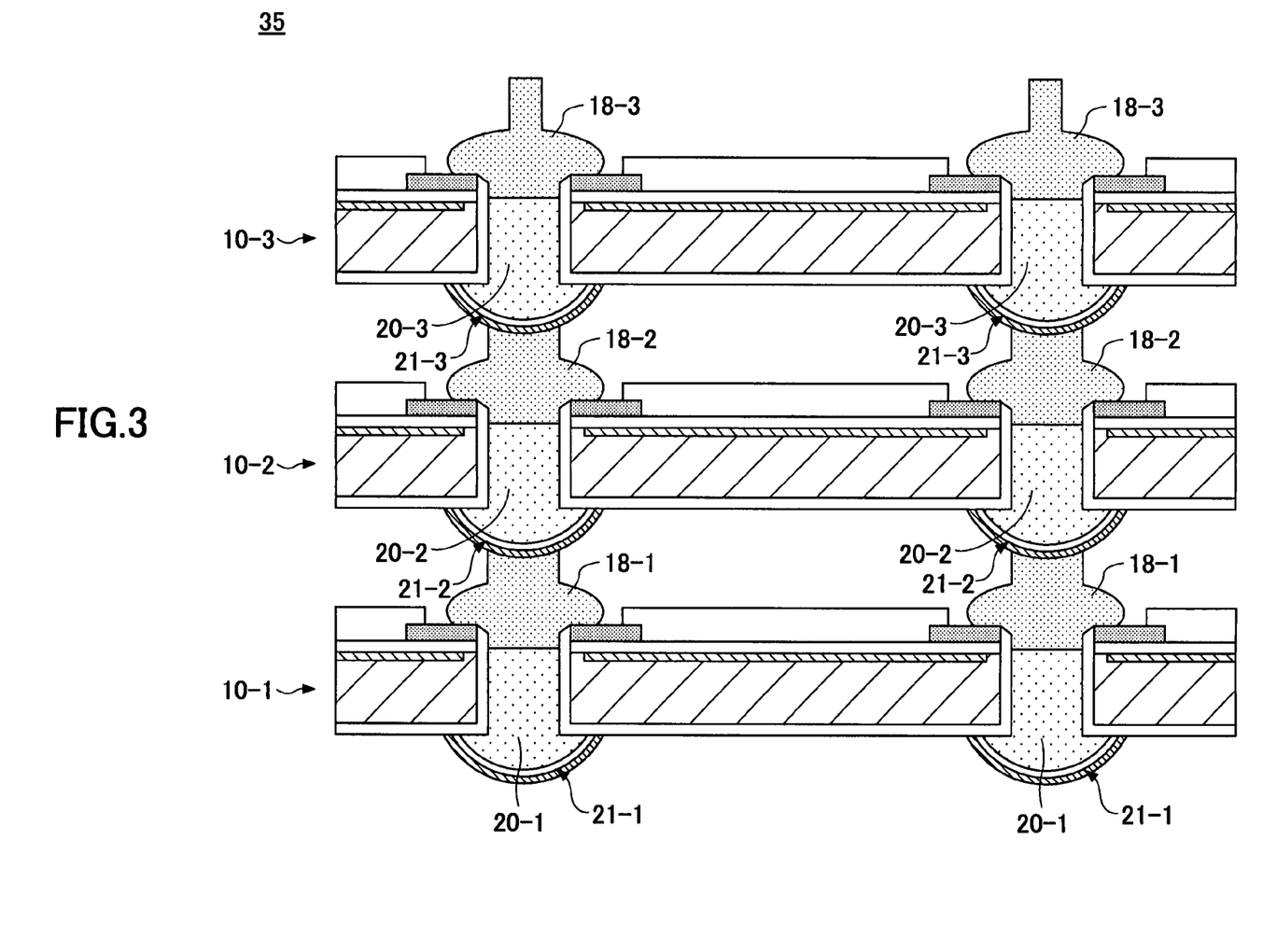
FIG. 3 is a drawing showing an example of a multi-chip package in which semiconductor chips of the above embodiment are stack one over another.

FIG. 3 is a drawing showing an example of a multi-chip package in which semiconductor chips of the above-described embodiment are stack one over another. FIG. 3 illustrates an example in which a multi-chip package 35 is formed by stacking three semiconductor chips 10 as described above one over another. In FIG. 3, for the sake of convenience of explanation, the constituent elements of a semiconductor chip 10-1 that is disposed at the bottom are referred to by reference numerals with "−1" attached at the end thereof, the constituent elements of a semiconductor chip 10-2 connected to the semiconductor chip 10-1 being referred to by reference numerals with "−2" attached at the end thereof, and the constituent elements of a semiconductor chip 10-3 connected to the semiconductor chip 10-2 being referred to by reference numerals with "−3" attached at the end thereof.

Referring to FIG. 3, the multi-chip package 35 is configured such that the semiconductor chip 10-2 and the semiconductor chip 10-3 are stacked in this order on the semiconductor chip 10-1. The Au bumps 18-1 of the semiconductor chip 10-1 are electrically connected to the through vias 20-2 of the semiconductor chip 10-2 via the dispersion preventive films 21-2, and the Au bumps 18-2 of the semiconductor chip 10-2 are electrically connected to the through vias 20-3 of the semiconductor chip 10-3 via the dispersion preventive films 21-3.

In this manner, the semiconductor chip 10 of the above-described embodiment is applicable to the multi-chip package 35 having the configuration as described above.

In FIG. 3, the multi-chip package 35 having three semiconductor chips 10 stacked one over another is used as an example. The number of the semiconductor chips 10 is not limited to this number. Further, the semiconductor chip 10 and a semiconductor chip of another type may be stacked one over another to constitute a multi-chip package.

FIG. 4 through FIG. 20 are drawings showing the steps of manufacturing the semiconductor chip according to an embodiment of the present invention. In FIG. 4 through FIG. 20, the same elements as those of the semiconductor chip 10 of the above-described embodiment are referred to by the same numerals. In FIG. 4 through FIG. 20, for the sake of convenience of explanation, the steps of manufacturing the semiconductor chip 10 are illustrated with respect to an area B shown in FIG. 2.

The steps of manufacturing the semiconductor chip 10 according to the embodiment of the present invention will now be described by referring to FIG. 4 through FIG. 20. At the beginning, as shown in FIG. 4, the semiconductor-device layer 12 is formed by use of a conventional technology on the first principal surface 11A of the semiconductor substrate 11 (having a thickness M2) prior to the thinning thereof, followed by forming the insulating film 13, the electrode pad 14, and the protection film 16 having the opening 16A successively on the semiconductor substrate 11 in which the semiconductor-device layer 12 is formed.

Specifically, an $SiO_2$ film (0.1 micrometer in thickness), for example, is formed as the insulating film 13 to cover the first principal surface 11A and the semiconductor-device layer 12 of the semiconductor substrate 11 by use of the CVD method. Then, an Al film is made to grow on the insulating film 13 through sputtering, followed by forming a resist film that is patterned in such a fashion as to correspond to the shape of the electrode pad 14. The resist film is then used as a mask to perform dry etching on the Al film, thereby forming the electrode pad 14. After this, an SiN film, for example, is made to grow as the protection film 16 by the CVD method on the insulating film 13 on which electrode pad 14 is formed. A resist film having an opening corresponding to the shape and position of the opening 16A is then formed on the SiN film. This resist film is used as a mask to perform dry etching on the SiN film, thereby forming the opening 16A for exposing the upper surface 14A of the electrode pad 14. The diameter R2 of the opening 16A may be 80 micrometers, for example.

As the insulating film 13, an SiN film (e.g., 0.1 micrometers in thickness) formed by the CVD method may be used in place of the $SiO_2$ film. As the semiconductor substrate 11, a silicon wafer having a thickness M2 of 625 micrometers prior to thinning may be used.

Figure 4:
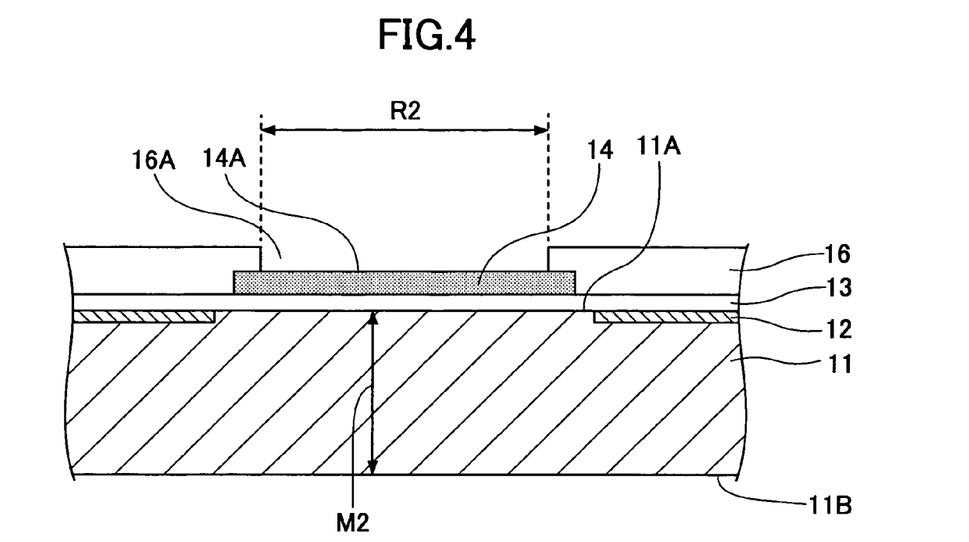
FIG. 4 is a drawing showing one of the steps of manufacturing the semiconductor chip according to an embodiment of the present invention.
Figure 5:
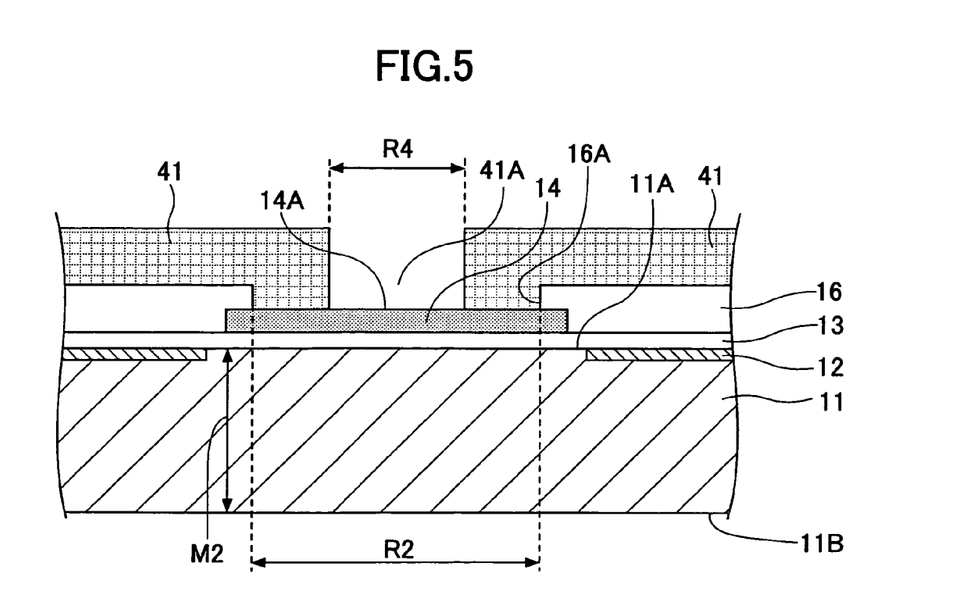
FIG. 5 is a drawing showing one of the steps of manufacturing the semiconductor chip according to the embodiment of the present invention.

Thereafter, a resist film 41 having an opening 41A is formed, as shown in FIG. 5, on the structure shown in FIG. 4. The opening 41A is an opening for exposing the upper surface 14A of the electrode pad 14. The diameter R4 of the opening 41A is substantially the same as the diameter R1 of the through hole 17, and is set narrower than the diameter R2 of the opening 16A. The diameter R4 of the opening 41A is preferably about half as large as the diameter R2 of the opening 16A. Specifically, the diameter R4 of the opening 41A may be 30 micrometers if the diameter R2 of the opening 16A is 80 micrometers.

Figure 6:
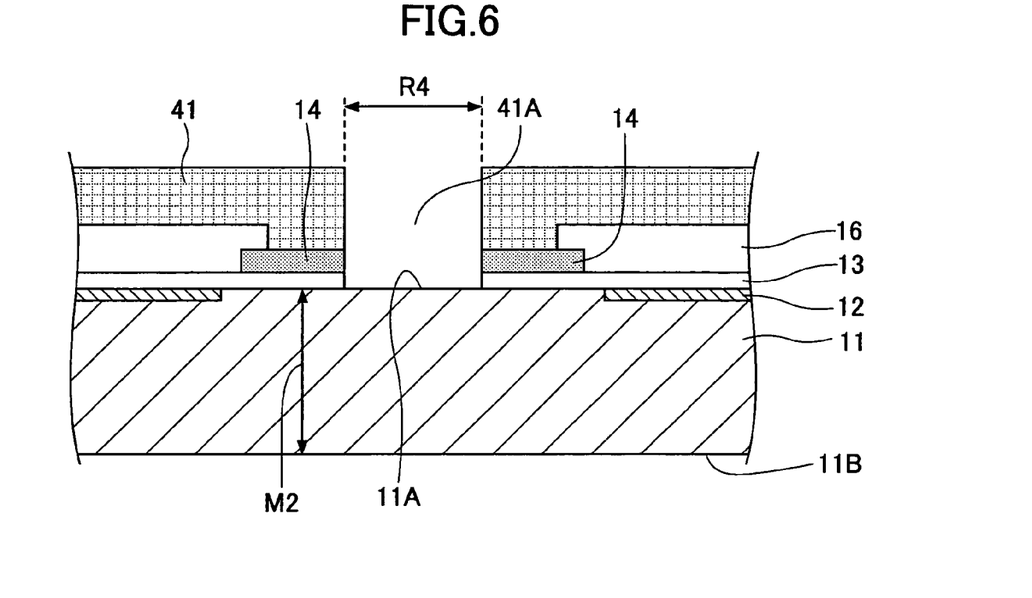
FIG. 6 is a drawing showing one of the steps of manufacturing the semiconductor chip according to the embodiment of the present invention.

Thereafter, as shown in FIG. 6, the resist film 41 is used as a mask to etch the electrode pad 14 and the insulating film 13 successively so as to expose the first principal surface 11A of the semiconductor substrate 11. The etching of the electrode pad 14 and the insulating film 13 may be performed by dry etching or wet etching.

Figure 7:
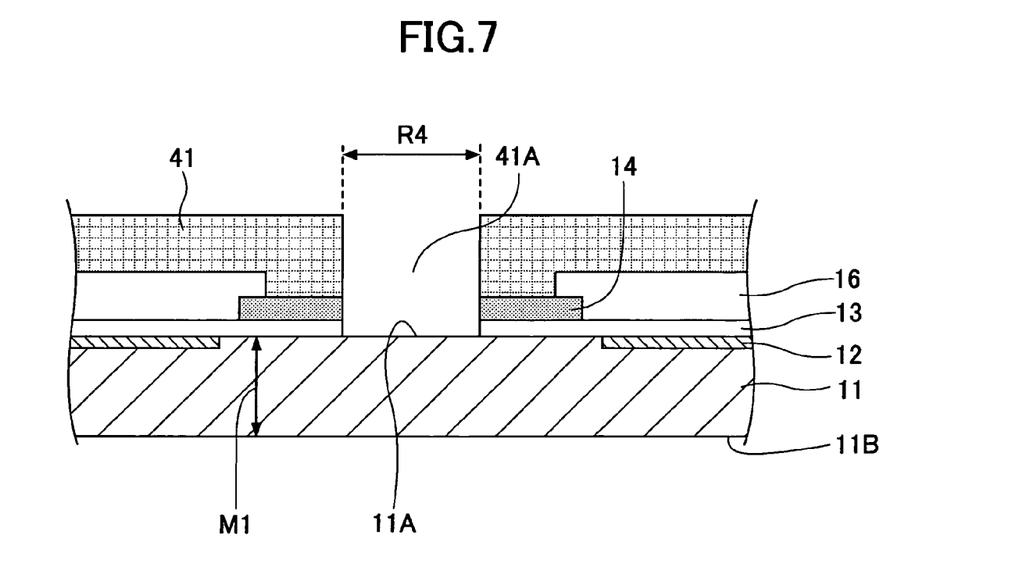
FIG. 7 is a drawing showing one of the steps of manufacturing the semiconductor chip according to the embodiment of the present invention.

As shown in FIG. 7, then, the semiconductor substrate 11 is made into a thinner plate from the side of the second principal surface 11B (substrate thinning step). A grinding method or etching method may be used to make the semiconductor substrate 11 thinner. Specifically, a grinder is used to perform the thinning such that the thickness M1 of the semiconductor substrate becomes 300 micrometers.

Such thinning of the semiconductor substrate 11 prior to the forming of the through hole 17 achieves a smaller aspect ratio for the through hole 17, thereby making it easier to make the through hole 17.

Figure 8:
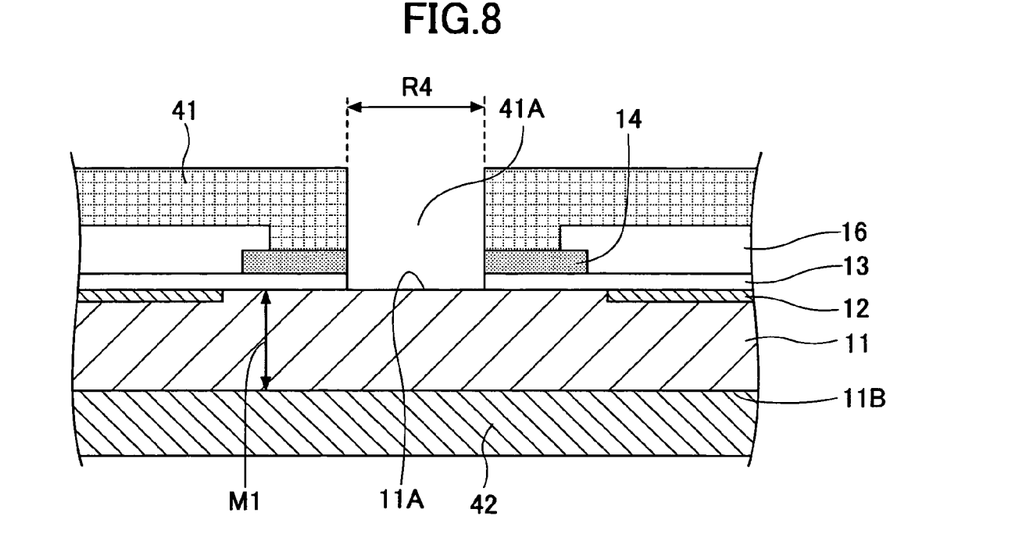
FIG. 8 is a drawing showing one of the steps of manufacturing the semiconductor chip according to the embodiment of the present invention.

Thereafter, as shown in FIG. 8, a protective tape 42 is adhered to the second principal surface 11B of the semiconductor substrate 11 made into a thin plate. The protective tape 42 serves to prevent damage to the stage of the etching apparatus on which the semiconductor substrate 11 is mounted when the through hole 17 to penetrate the semiconductor substrate 11 is formed by dry etching.

A PET base which is coated with an acrylic adhesive may be used as the protective tape 42. The thickness of the protective tape 42 may be 100 micrometers to 200 micrometers, for example.

Figure 9:
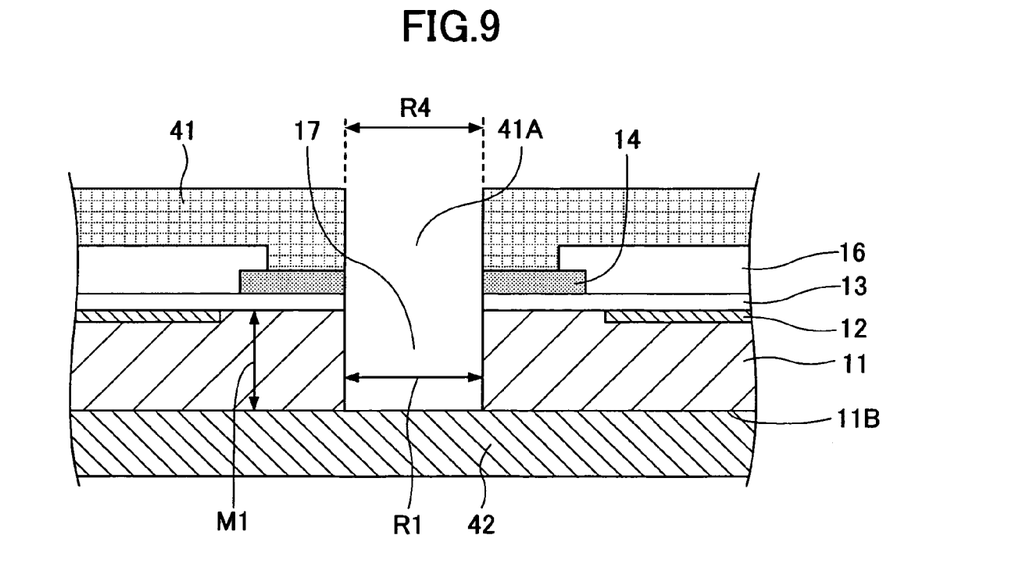
FIG. 9 is a drawing showing one of the steps of manufacturing the semiconductor chip according to the embodiment of the present invention.

Thereafter, as shown in FIG. 9, the resist film 41 is used as a mask to perform dry etching until the semiconductor substrate 11 is penetrated, thereby forming the through hole 17 having the diameter R1 penetrating through the semiconductor substrate 11, the insulating film 13, and the electrode pad 14 (through hole forming step). The diameter R1 of the through hole 17 is substantially the same as the diameter R4 of the opening 41A. The diameter R1 of the through hole 17 may be 30 micrometers, for example.

Figure 10:
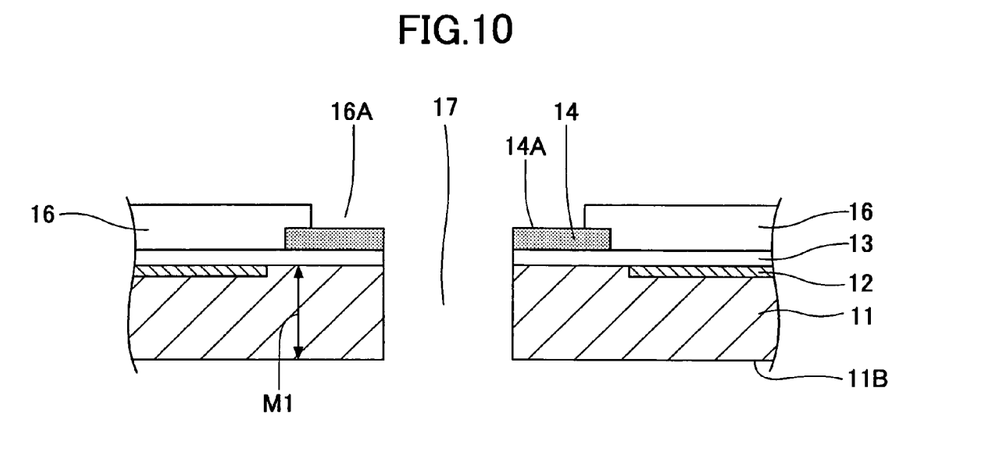
FIG. 10 is a drawing showing one of the steps of manufacturing the semiconductor chip according to the embodiment of the present invention.
Figure 11:
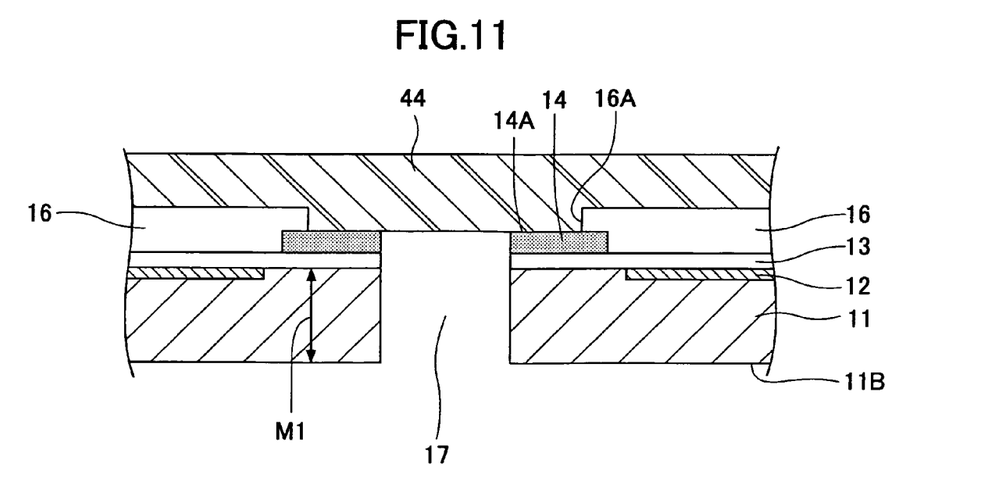
FIG. 11 is a drawing showing one of the steps of manufacturing the semiconductor chip according to the embodiment of the present invention.

As shown in FIG. 10, then, the protective tape 42 is peeled off, followed by removing the resist film 41. Thereafter, as shown in FIG. 11, an insulating-film-removal tape 44 is adhered to the upper surface of the structure shown in FIG. 10. In so doing, the insulating-film-removal tape 44 is disposed such as to cover the upper surface 14A of the electrode pad 14 (i.e., such as to fill the opening 16A of the protection film 16). A PET base which is coated with an acrylic adhesive may be used as the insulating-film-removal tape 44. The thickness of the insulating-film-removal tape 44 may be 100 micrometers to 200 micrometers, for example.

Figure 12:
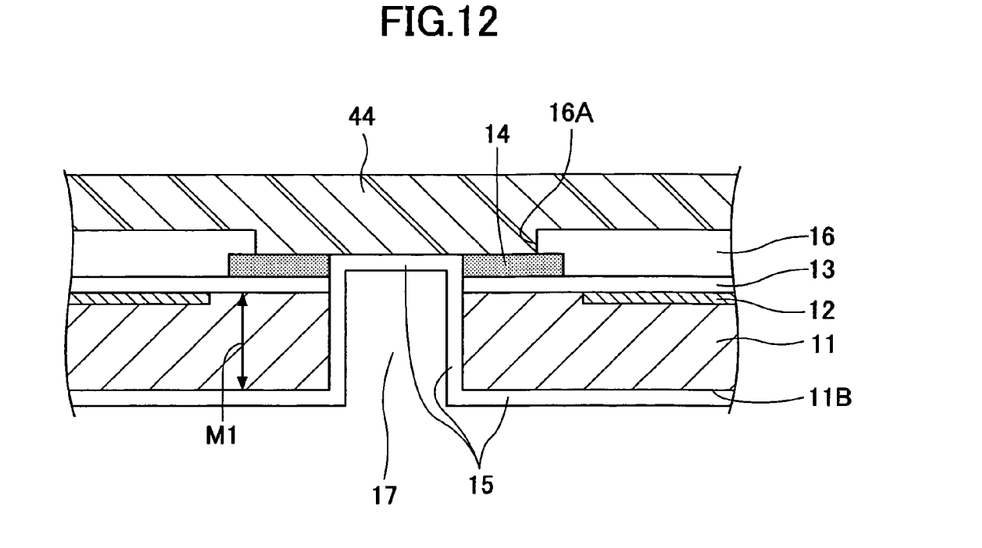
FIG. 12 is a drawing showing one of the steps of manufacturing the semiconductor chip according to the embodiment of the present invention.

As shown in FIG. 12, then, the insulating film 15 is formed from the direction of the second principal surface 11B of the semiconductor substrate 11 such as to cover the second principal surface 11B of the semiconductor substrate 11 and the side walls of the through hole 17 (insulating film forming step). In so doing, the insulating film 15 is also formed on the insulating-film-removal tape 44 that is exposed through the through hole 17. Specifically, the CVD method, for example, may be used to form an $SiO_2$ film (1 micrometer in thickness) as the insulating film 15.

Figure 13:
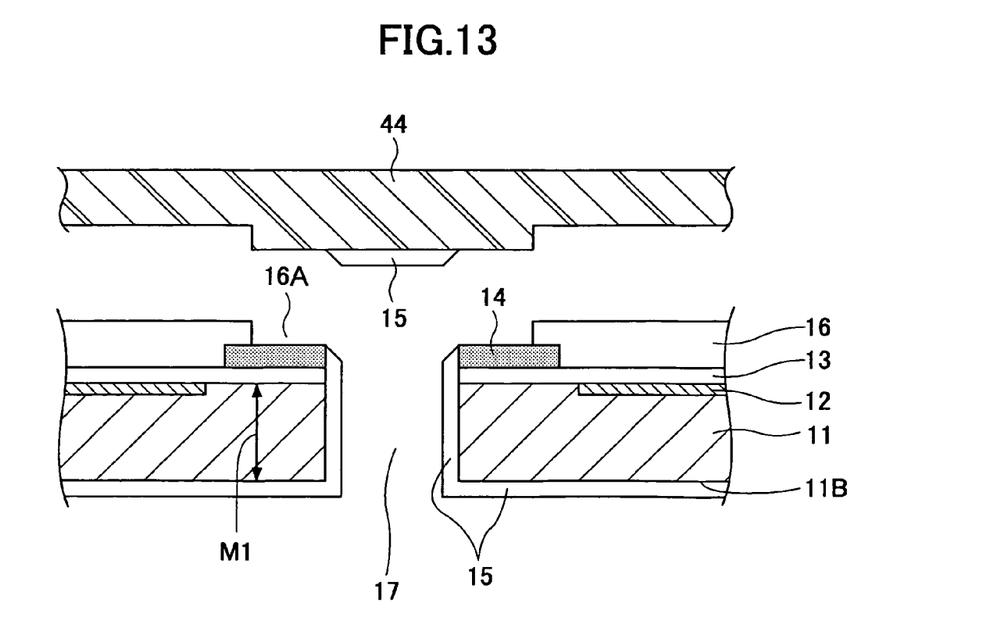
FIG. 13 is a drawing showing one of the steps of manufacturing the semiconductor chip according to the embodiment of the present invention.

As shown in FIG. 13, then, the insulating-film-removal tape 44 with the insulating film 15 formed thereon is peeled off, thereby removing an unneeded insulating film 15 (i.e., the insulating film 15 that is formed on the insulating-film-removal tape 44).

Figure 14:
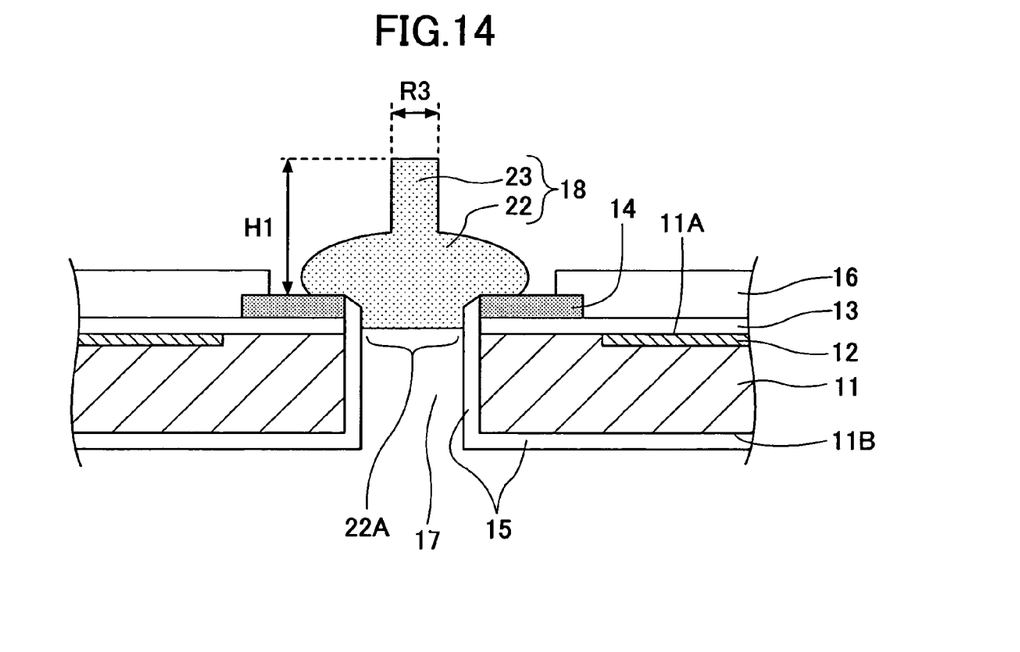
FIG. 14 is a drawing showing one of the steps of manufacturing the semiconductor chip according to the embodiment of the present invention.

As shown in FIG. 14, then, the Au bump 18 having the ball-shape part 22 and the rod-shape part 23 is formed on the electrode pad 14 and in the through hole 17 on the first principal surface 11A side of the semiconductor substrate 11 (Au bump forming step). In so doing, the Au bump 18 is disposed to cover the open end of the through hole 17 situated on the first principal surface 11A side of the semiconductor substrate 11.

In this manner, the Au bump 18 is formed on the electrode pad 14 and in the through hole 17 situated on the side belonging to the first principal surface 11A, so that an electrical connection can easily be established between the electrode pad 14 and the through via 20, compared with the conventional semiconductor chip 100. This can simplify the manufacturing steps of the semiconductor chip 10, and can also reduce the manufacturing cost of the semiconductor chip 10.

It should be noted that the Au bump 18 may preferably be formed such that the ball-shape part 22 intrudes into the through hole 17 (i.e., the tip 22A of the ball-shape part 22 is positioned inside the through hole 17).

The provision of the Au bump 18 in such a fashion as to have the ball-shape part 22 intruding into the through hole 17 shortens the length of the through via 20. With this provision, the time of the electroplating process for forming the through vias 20 is shortened, thereby reducing the cost of the semiconductor chip 10. The height H1 of the Au bumps 18 may be 70 micrometers to 80 micrometers, for example. The diameter R3 of the rod-shape part 23 may be 20 micrometers, for example.

Figure 15:
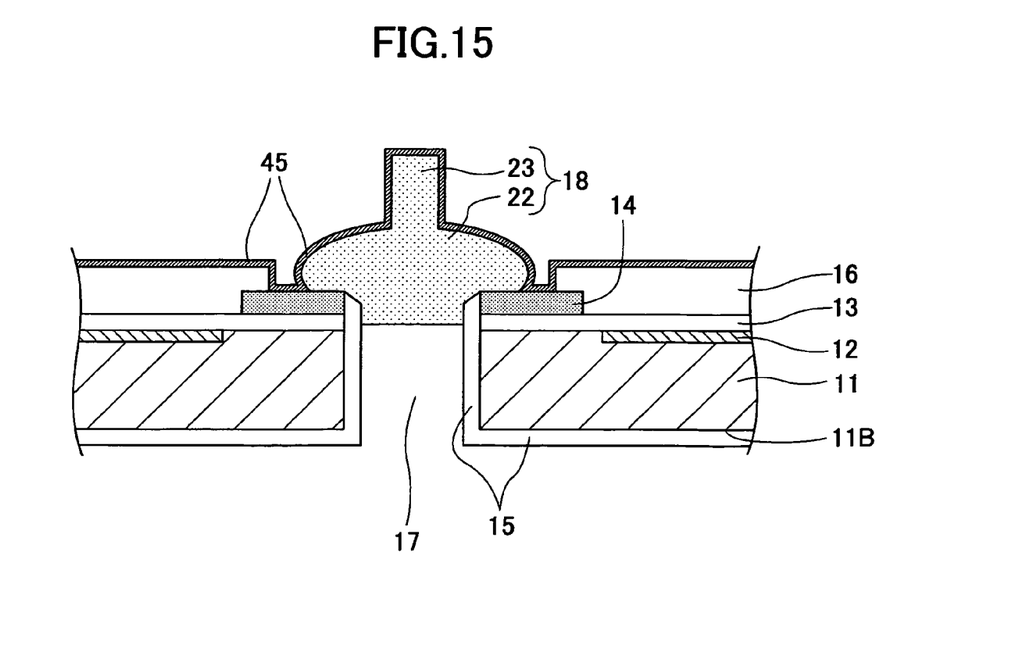
FIG. 15 is a drawing showing one of the steps of manufacturing the semiconductor chip according to the embodiment of the present invention.

Thereafter, a metal layer 45 is formed, as shown in FIG. 15, to cover the upper surfaces of the structure shown in FIG. 14. The metal layer 45 electrically connects between a plurality of Au bumps 18. The metal layer 45 is provided for the purpose of applying a voltage to all the Au bumps 18 when forming the through vias 20 through electroplating. The metal layer 45 may be formed by use of the sputter method or vapor deposition method, for example. A Cu layer, for example, may be used as the metal layer 45. The thickness of the metal layer 45 may be 0.5 micrometers, for example.

Figure 16:
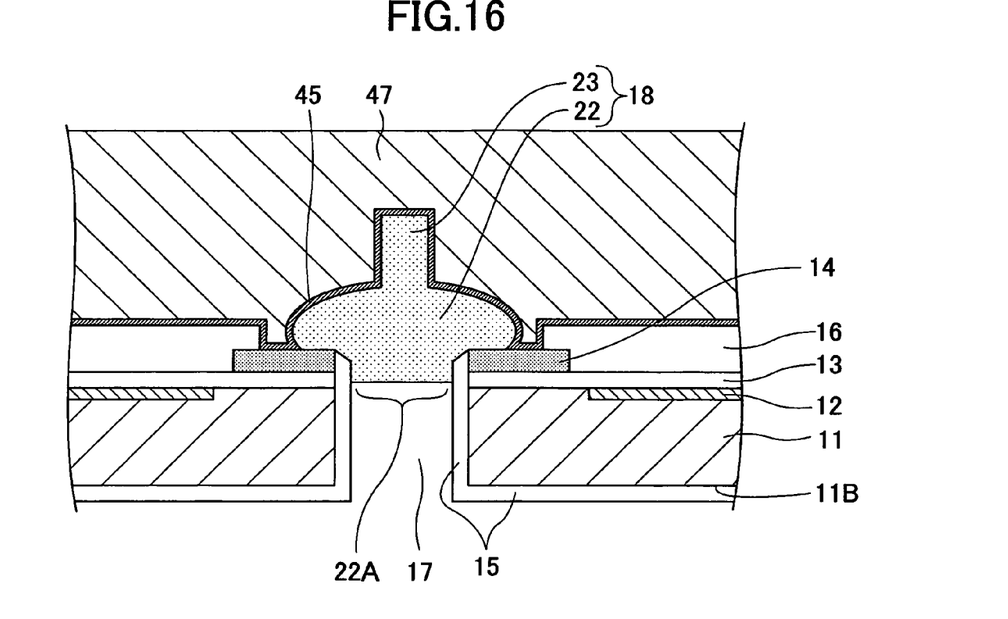
FIG. 16 is a drawing showing one of the steps of manufacturing the semiconductor chip according to the embodiment of the present invention.

Thereafter, as shown in FIG. 16, a protective tape 47 is adhered to the upper surfaces of the structure shown in FIG. 15. The protective tape 47 is provided for the purpose of preventing conductive metal from being disposed on the metal layer 45 when forming the through vias 20 through electroplating. A PET base which is coated with an acrylic adhesive may be used as the protective tape 47. The thickness of the protective tape 47 may be 100 micrometers to 200 micrometers, for example.

Figure 17:
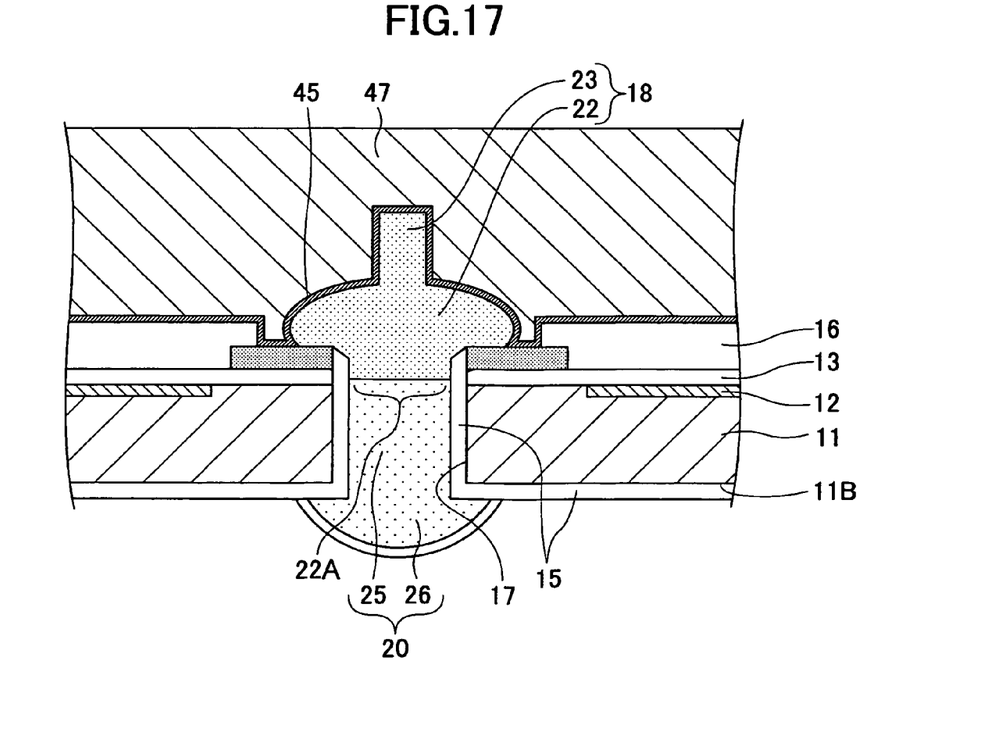
FIG. 17 is a drawing showing one of the steps of manufacturing the semiconductor chip according to the embodiment of the present invention.

As shown in FIG. 17, then, a voltage is applied to the metal layer 45 so as to deposit a conductive metal on the tip 22A of the ball-shape part 22 of the Au bump 18 through electroplating utilizing the Au bump 18 as a power feeding layer. The conductive metal thus grows from the tip 22A of the ball-shape part 22 along the depth direction of the through hole 17 (downward in FIG. 17), thereby forming the through via 20 having the through part 25 and the projection 26 (through via forming step).

In this manner, the electroplating process utilizing the Au bump 18 as a power feeding layer is performed such that conductive metal is deposited to grow from the tip 22A of the ball-shape part 22 along the depth direction of the through hole 17, thereby forming the through via 20. This provision can prevent a void from appearing in the through via 20.

Further, the projection 26 serving to function as an eternal connection terminal is formed together with the through part 25, so that the number of process steps is fewer than in the case in which a pad is formed separately at the bottom of the through part 25. This can reduce the manufacturing cost of the semiconductor chip 10.

Figure 18:
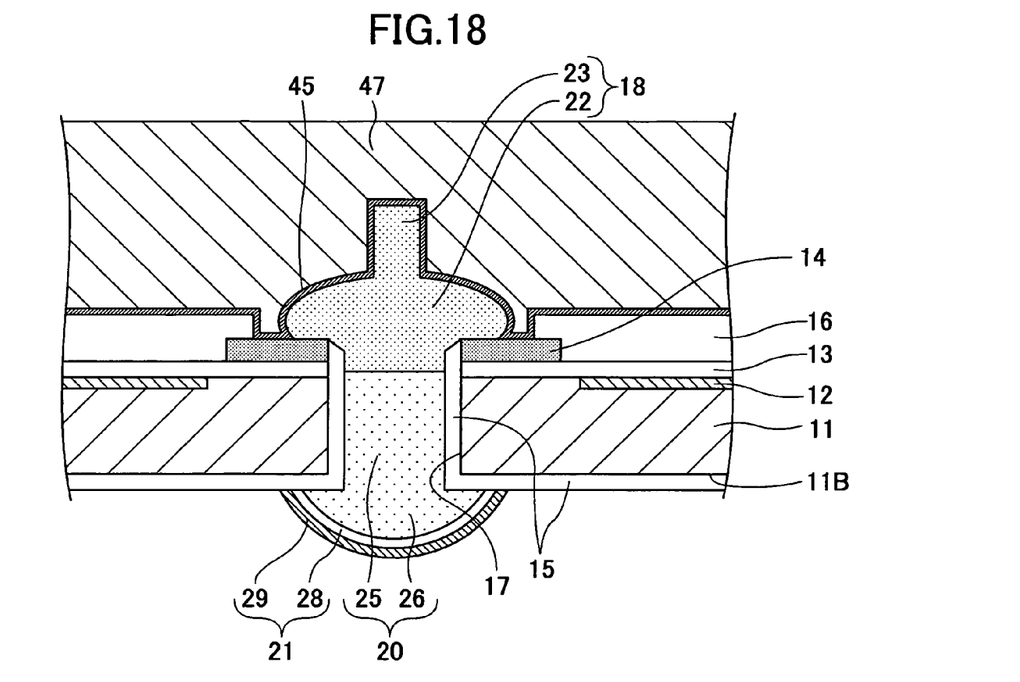
FIG. 18 is a drawing showing one of the steps of manufacturing the semiconductor chip according to the embodiment of the present invention.

Thereafter, as shown in FIG. 18, a voltage is applied to the metal layer 45 to form the Ni layer 28 covering the projection 26 and the Au layer 29 covering the Ni layer 28 through electroplating. In this manner, the dispersion preventive film 21 comprised of the Ni layer 28 and the Au layer 29 is formed.

Figure 19:
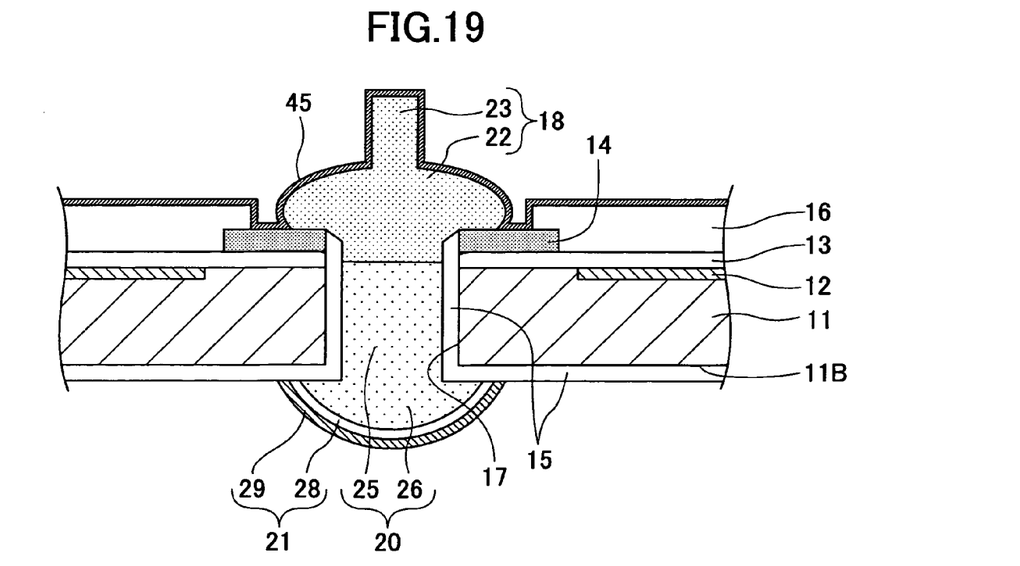
FIG. 19 is a drawing showing one of the steps of manufacturing the semiconductor chip according to the embodiment of the present invention.
Figure 20:
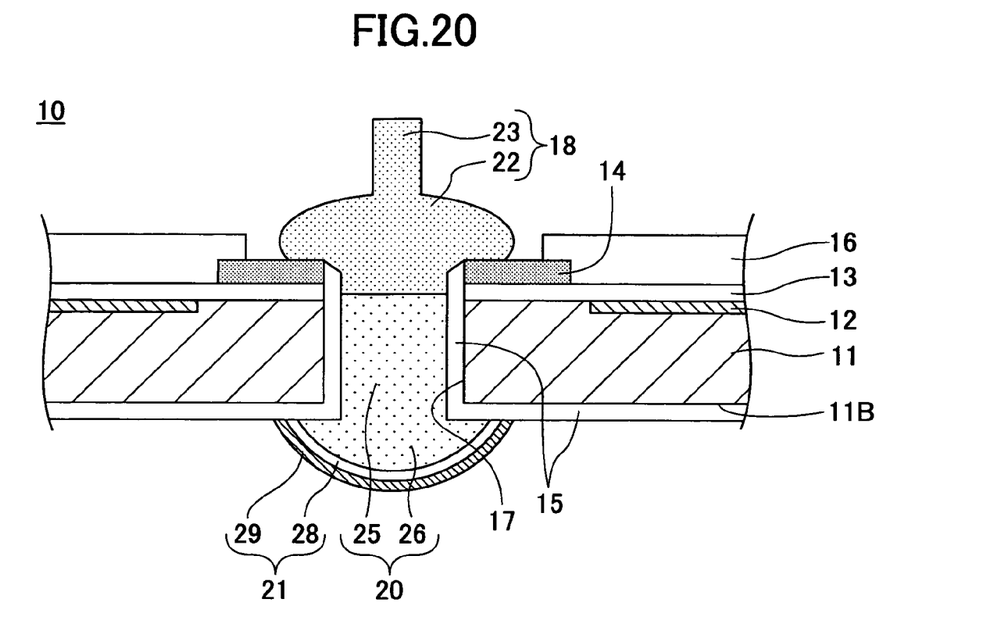
FIG. 20 is a drawing showing one of the steps of manufacturing the semiconductor chip according to the embodiment of the present invention.

As shown in FIG. 19, then, the protective tape 47 is peeled off. After this, as shown in FIG. 20, the metal layer 45 is removed. With this, the making of the semiconductor chip 10 is completed.

According to the method of manufacturing a semiconductor chip according to this embodiment, the Au bump 18 is formed on the electrode pad 14 and in the through hole 17 on the side corresponding to the first principal surface 11A after the insulating film forming step, so that an electrical connection can easily be established between the electrode pad 14 and the through via 20, compared with the conventional semiconductor chip 100. This can simplify the manufacturing steps of the semiconductor chip 10, and can also reduce the manufacturing cost of the semiconductor chip 10.

Further, the forming of the through via 20 by use of an electroplating process utilizing the Au bump 18 as a power feeding layer causes the conductive metal to grow from the Au bump 18 along the depth direction of the through hole 17, thereby successfully avoiding the creation of a void in the through via 20.

Further, the present invention is not limited to these embodiments, but various variations and modifications may be made without departing from the scope of the present invention.

It should be noted that the present invention is applicable to a semiconductor chip and a method of manufacturing the semiconductor chip that can avoid the generation of a void in the through via and that can also reduce the cost inclusive of the manufacturing cost.

The present application is based on Japanese priority application No. 2005-303443 filed on Oct. 18, 2005, with the Japanese Patent Office, the entire contents of which are hereby incorporated by reference.

What is claimed is:

1. A semiconductor chip, comprising:
   a semiconductor substrate having a first principal surface, and having a device layer on the first principal surface in which a semiconductor device is formed;
   an electrode pad disposed on the first principal surface of the semiconductor substrate and electrically connected to the semiconductor device;
   an insulating film disposed to cover a side wall of a through hole penetrating through the semiconductor substrate and the electrode pad;
   a through via fully filing the through hole without leaving a gap between the through via and the insulating film, the through via being not in direct contact with the electrode pad; and
   an Au bump deposited on the electrode pad and the through via such as to electrically connect between the electrode pad and the through via, the Au bump being in direct contact with the electrode pad and formed by wire bonding such as to intrude into the through hole.

2. The semiconductor chip as claimed in claim 1, wherein the through via includes a projection that projects from a second principal surface of the semiconductor substrate opposite to the first principal surface.

* * * * *